United States Patent
Yamazawa (10) Patent No.: US 10,700,615 B2
(45) Date of Patent: Jun. 30, 2020

(54) INVERTER DEVICE

(71) Applicant: FUJI ELECTRIC CO., LTD., Kawasaki-shi, Kanagawa (JP)

(72) Inventor: Kotaro Yamazawa, Suzuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/139,711

(22) Filed: Sep. 24, 2018

(65) Prior Publication Data
US 2019/0165687 A1  May 30, 2019

(30) Foreign Application Priority Data

Nov. 28, 2017 (JP) .................. 2017-228074

(51) Int. Cl.
| | |
|---|---|
| *H05K 5/00* | (2006.01) |
| *H02M 7/00* | (2006.01) |
| *H02M 7/48* | (2007.01) |
| *H05K 7/14* | (2006.01) |
| *B32B 15/082* | (2006.01) |
| *C09J 7/22* | (2018.01) |
| *H05K 5/02* | (2006.01) |

(52) U.S. Cl.
CPC .......... *H02M 7/003* (2013.01); *B32B 15/082* (2013.01); *C09J 7/22* (2018.01); *H02M 7/48* (2013.01); *H05K 5/0008* (2013.01); *H05K 5/0239* (2013.01); *H05K 7/1427* (2013.01); *H05K 7/1432* (2013.01); *B32B 2307/71* (2013.01)

(58) Field of Classification Search
USPC .......................................... 361/752
See application file for complete search history.

(56) References Cited

U.S. PATENT DOCUMENTS

| | | | | |
|---|---|---|---|---|
| 5,459,322 A | * | 10/1995 | Warkentin | A61M 1/3616 250/455.11 |
| 5,497,289 A | * | 3/1996 | Sugishima | H02M 7/003 318/558 |
| 6,147,867 A | * | 11/2000 | Gaudrel | H05K 7/209 361/690 |
| 2008/0157716 A1 | * | 7/2008 | Jo | H02J 7/0044 320/115 |
| 2015/0097471 A1 | * | 4/2015 | Bailey | H05K 5/061 312/100 |
| 2017/0155336 A1 | * | 6/2017 | Yamazawa | H02M 7/003 |

FOREIGN PATENT DOCUMENTS

JP   2008-154331 A   7/2008

* cited by examiner

*Primary Examiner* — Hung S. Bui
(74) *Attorney, Agent, or Firm* — Manabu Kanesaka (57) ABSTRACT

An inverter device includes a sheet member that hermetically covers an operating section through which a user operates an inverter body and an ultraviolet shielding member that covers the operating section and the sheet member and shields ultraviolet rays.

14 Claims, 8 Drawing Sheets

INVERTER DEVICE

CROSS-REFERENCE TO RELATED APPLICATION

The present application claims priority of Japanese Patent Application number JP2017-228074 filed Nov. 28, 2017, the disclosure of which is hereby incorporated by reference.

BACKGROUND OF THE INVENTION

Field of the Invention

The present invention relates to an inverter device, and more particularly, it relates to an inverter device including an operating section used to operate an inverter body.

Description of the Background Art

An inverter device including an operating section used to operate an inverter body is known in general, as disclosed in Japanese Patent Laid-Open No. 2008-154331.

An inverter device disclosed in Japanese Patent Laid-Open No. 2008-154331 includes a unit case. In the unit case, an operation panel is combined with an assembly of a main circuit including a semiconductor module and a control circuit, and is housed. The operation panel is exposed from an opening of a front cover provided on the front surface of the unit case. Thus, a user can operate the operation panel without removing the front cover. Although not clearly stated in Japanese Patent Laid-Open No. 2008-154331, conventionally, a sheet member that seals the operation panel may cover the front surface (operation surface) of the operation panel for waterproofing or dustproofing.

However, in the conventional inverter device including the sheet member, when the inverter device is irradiated with ultraviolet rays, the sheet member is disadvantageously deteriorates due to the ultraviolet rays. In this case, the sealing property of the operation panel disadvantageously deteriorates due to the deterioration of the sheet member.

SUMMARY OF THE INVENTION

The present invention has been proposed in order to solve the aforementioned problem, and an object of the present invention is to provide an inverter device capable of significantly reducing or preventing deterioration of a sheet member due to ultraviolet rays and significantly reducing or preventing deterioration of the sealing property of an operation panel.

In order to attain the aforementioned object, an inverter device according to an aspect of the present invention includes an inverter body, a housing that covers the inverter body, an operating section attached to the housing and through which the inverter body is operated, a sheet member that hermetically covers the operating section, and an ultraviolet shielding member that covers the operating section and the sheet member and shields ultraviolet rays.

In the inverter device according to this aspect of the present invention, as described above, the ultraviolet shielding member covers the operating section and the sheet member such that the ultraviolet shielding member can significantly reduce or prevent irradiation of the sheet member with ultraviolet rays, and thus it is possible to significantly reduce or prevent deterioration of the sheet member due to ultraviolet rays. Consequently, it is possible to significantly reduce or prevent deterioration of the sealing property of the operating section due to the deterioration of the sheet member.

In the aforementioned inverter device according to this aspect, the ultraviolet shielding member is preferably openable and closable with respect to an outer surface of the housing to expose the operating section. According to this configuration, only when necessary, such as when the user operates the operating section, the ultraviolet shielding member can be opened to expose the operating section. Consequently, the ultraviolet shielding member can significantly reduce or prevent deterioration of the sheet member due to ultraviolet rays while user's operability is ensured.

In this case, the ultraviolet shielding member is preferably movable along the outer surface of the housing to expose the operating section. According to this configuration, when the user moves the ultraviolet shielding member, the ultraviolet shielding member does not move toward the user (front side), and thus even in a narrow space where a device is disposed around the ultraviolet shielding member, the ultraviolet shielding member can be easily moved.

The aforementioned inverter device in which the ultraviolet shielding member is movable along the outer surface of the housing preferably further includes a first fastening member that attaches the ultraviolet shielding member to the outer surface of the housing, and the first fastening member preferably attaches the ultraviolet shielding member to the outer surface of the housing such that the ultraviolet shielding member is pivotable along the outer surface of the housing to expose the operating section. According to this configuration, the ultraviolet shielding member can be pivoted using the first fastening member used to attach the ultraviolet shielding member to the outer surface of the housing, and thus it is possible to simplify the device configuration and significantly reduce or prevent an increase in the number of components.

In this case, the inverter device preferably further includes a spacer member provided in a vicinity of an outer edge of the ultraviolet shielding member and through which the first fastening member passes, and the first fastening member is preferably fastened to the outer surface of the housing in a state where the first fastening member passes through the spacer member such that the ultraviolet shielding member is attached to the outer surface of the housing so as to be pivotable along the outer surface of the housing. According to this configuration, the spacer member is used such that the ultraviolet shielding member is not directly fastened to the outer surface of the housing by the first fastening member, and thus the ultraviolet shielding member can be easily pivoted. Note that the vicinity of the outer edge of the ultraviolet shielding member includes both the position itself of the outer edge of the ultraviolet shielding member and the vicinity of the position of the outer edge of the ultraviolet shielding member.

In the aforementioned inverter device including the spacer member, the ultraviolet shielding member preferably has a substantially rectangular shape, a through-hole to which the spacer member is attached is preferably provided in a vicinity of a first corner of the ultraviolet shielding member having the substantially rectangular shape, a cutout is preferably provided in a vicinity of a second corner corresponding to a diagonal corner of the first corner, and the inverter device preferably further includes a second fastening member that fixes the ultraviolet shielding member to the outer surface of the housing in a state where the second fastening member passes through the cutout. According to this configuration, when the ultraviolet shielding member is not pivoted, the ultraviolet shielding member can be securely fixed by the second fastening member. Furthermore, the second fastening member passes through the cutout such that the second fastening member can be pulled out of the cutout via an open end of the cutout. Thus, it is possible to pivot the ultraviolet shielding member without removing the second fastening member from the outer surface. Note that the vicinity of the first corner (second corner) includes both the position itself of the first corner (second corner) and the vicinity of the position of the first corner (second corner).

In this case, the second fastening member preferably includes a thumbscrew member, and when the thumbscrew member is loosened, the thumbscrew member preferably passes through the cutout such that the ultraviolet shielding member is pivotable. According to this configuration, the second fastening member includes the thumbscrew member such that the user can easily loosen (tighten) the second fastening member by pinching the same with their fingers without using a tool. Consequently, the user can easily perform an operation of loosening (tightening) the second fastening member in order to pivot (fix) the ultraviolet shielding member.

In the aforementioned inverter device according to this aspect, the outer surface of the housing preferably has a substantially rectangular shape as viewed from a front side of the inverter body, and the ultraviolet shielding member is preferably provided in a substantially central portion of the housing in a horizontal direction in a state where the inverter body is installed. According to this configuration, when the ultraviolet shielding member is moved (pivoted) to expose the operating section, it is possible to significantly reduce or prevent protrusion of the ultraviolet shielding member in the horizontal direction from an end of the housing in the horizontal direction as compared with the case where the ultraviolet shielding member is provided on the end side of the housing in the horizontal direction. Thus, it is possible to significantly reduce or prevent interference between the ultraviolet shielding member and a surrounding device when the other device is disposed adjacent to the inverter device in the horizontal direction.

Furthermore, as compared with the case where the ultraviolet shielding member is provided on the end side of the housing in the horizontal direction, it is possible to significantly reduce or prevent interference between the user and the other device when the other device is disposed adjacent to the inverter device in the horizontal direction, and it is possible to significantly reduce or prevent a reduction in the working efficiency of the user.

In the aforementioned inverter device according to this aspect, an operating section-side opening is preferably provided at a position of the housing where the operating section is disposed, and the inverter device preferably further includes an operating section-side sealing member provided in close contact with a circumferential edge of the operating section-side opening on a rear surface of the housing and disposed in close contact with a surface of an outer edge of the sheet member on the housing side. According to this configuration, as compared with the case where the operating section-side sealing member and the sheet member are disposed in close contact with each other on the outside (outer surface side) of the housing, it is possible to significantly reduce or prevent release of close contact between the operating section-side sealing member and the sheet member due to external factors. Consequently, it is possible to further significantly reduce or prevent deterioration of the sealing property of the operating section provided by the sheet member.

In this case, the inverter device preferably further includes a fixture provided on an opposite side of the operating section relative to the housing and that sandwiches the operating section with the sheet member, and a sheet metal member fixed to the rear surface of the housing in a state where the fixture, the operating section, the sheet member, and the operating section-side sealing member are sandwiched between the sheet metal member and the rear surface of the housing. According to this configuration, the operating section and the sheet member can be securely held by the fixture and the sheet metal member.

The aforementioned inverter device including the fixture and the sheet metal member preferably further includes a third fastening member fastened to the rear surface of the housing via the sheet metal member in a state where the fixture, the operating section, the sheet member, and the operating section-side sealing member are sandwiched between the sheet metal member and the rear surface of the housing. According to this configuration, the operating section and the sheet member can be pressure-bonded by the third fastening member. Consequently, the sealing property of the operating section provided by the sheet member can be improved.

In the aforementioned inverter device according to this aspect, the housing preferably includes a box-shaped housing body that houses the inverter body, and an openable and closable housing lid to which the operating section is attached and that covers the box-shaped housing body, and the inverter device preferably further includes a housing-side sealing member provided between the housing body and the housing lid. According to this configuration, the housing-side sealing member can significantly reduce or prevent entry of moisture, dust, etc. into the housing body.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

Present Embodiment

The configuration of an inverter device 100 according to the present embodiment is now described with reference to FIGS. 1 to 15.

The inverter device 100 is used to drive a motor of a filtration device or the like provided outdoors, for example. The inverter device 100 is connected outdoors to the motor of the filtration device or the like.

(Configuration of Inverter Device)

Figure 1:
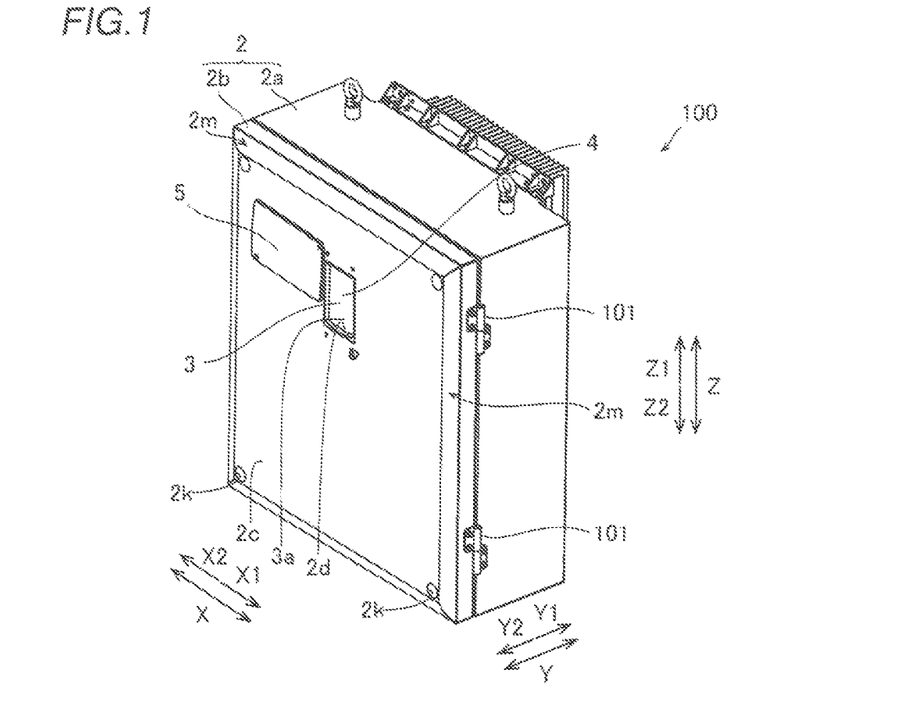
FIG. 1 is a perspective view showing a state where an operation panel of an inverter device according to an embodiment is exposed.
Figure 14:
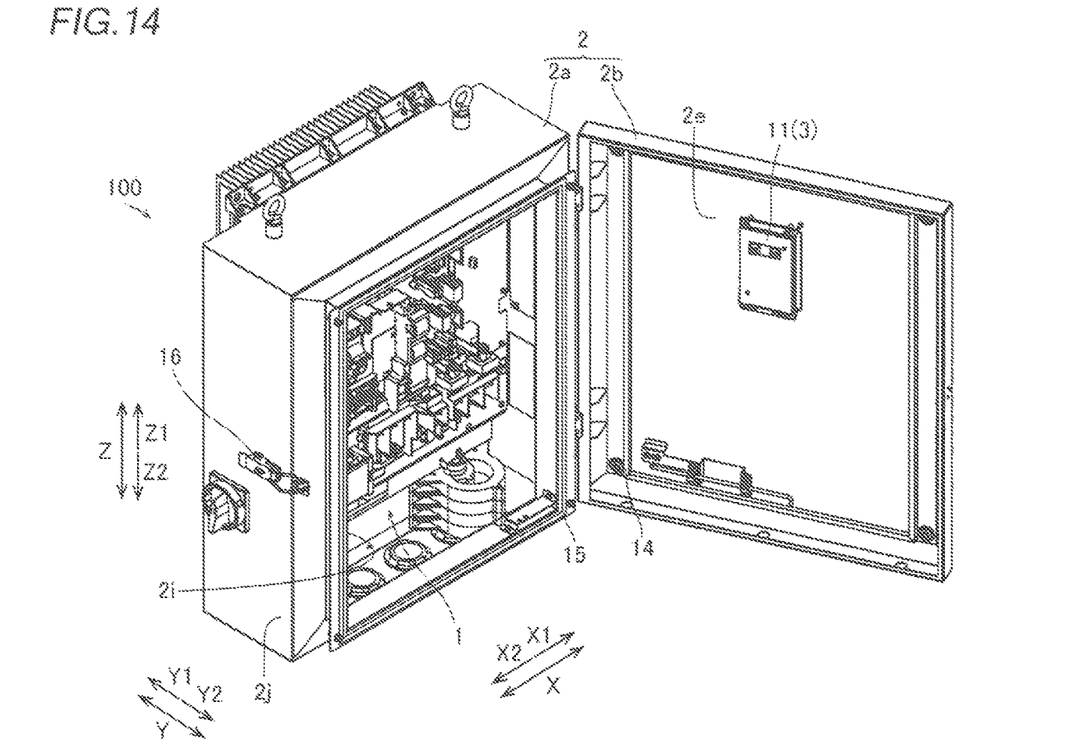
FIG. 14 is a perspective view showing a state where the housing lid of the inverter device according to the embodiment is opened.

As shown in FIG. 1, the inverter device 100 includes an inverter body 1 (see FIG. 14). In addition, the inverter device 100 includes a housing 2 that covers the inverter body 1. Specifically, the housing 2 includes a box-shaped housing body 2a that houses the inverter body 1. Furthermore, the housing 2 includes a housing lid 2b that covers the box-shaped housing body 2a.

The housing body 2a and the housing lid 2b are connected to each other by two hinges 101 provided in an upward-downward direction (direction Z), and the housing lid 2b is openable and closable with the hinges 101 as fulcrums.

Figure 2:
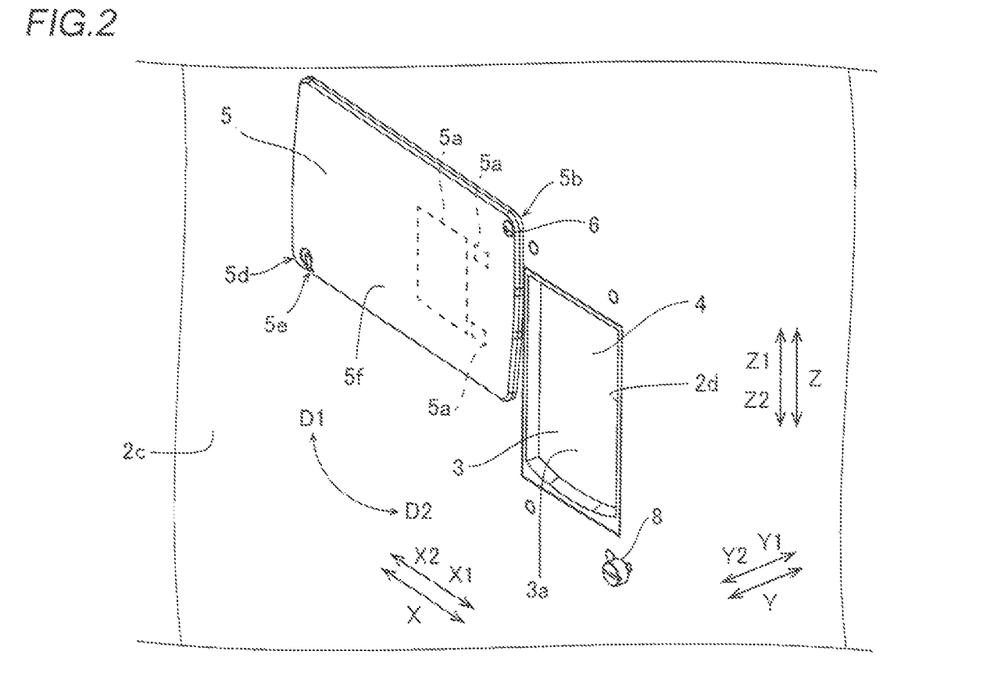
FIG. 2 is an enlarged view of FIG. 1.

As shown in FIGS. 1 and 2, the inverter device 100 includes an operation panel 3 attached to the housing 2 (housing lid 2b). The operation panel 3 is used to operate the inverter body 1. Specifically, the operation panel 3 is a push button type controller, and a user operates the inverter device 100 (inverter body 1) by pushing buttons of the operation panel 3. The operation panel 3 is an example of an "operating section" in the claims.

The housing 2 (housing lid 2b) includes an outer surface 2c having a substantially rectangular shape as viewed from the front side (Y2 direction side) of the inverter body 1. In addition, an opening 2d is provided at a position of the housing 2 (housing lid 2b) where the operation panel 3 is disposed. The opening 2d is provided on the outer surface 2c of the housing 2 (housing lid 2b). The opening 2d has a substantially rectangular shape as viewed from the front side (Y2 direction side) of the inverter body 1. The opening 2d is an example of an "operating section-side opening" in the claims.

An operation surface 3a of the operation panel 3 is exposed from the opening 2d. Note that the operation surface 3a of the operation panel 3 is positioned on the inner side (Y1 direction side) of the housing 2 relative to the outer surface 2c of the housing 2 (housing lid 2b). That is, a recess recessed toward the Y1 direction side is defined by the opening 2d and the operation surface 3a.

The inverter device 100 includes a sealing sheet 4 that hermetically covers the operation panel 3. The sealing sheet 4 is made of PET (polyethyleneterephthalate) resin, for example. A method for disposing the sealing sheet 4 is described below in detail. The sealing sheet 4 is an example of a "sheet member" in the claims.

According to the present embodiment, the inverter device 100 includes an acrylic plate 5 that covers the operation panel 3 (operation surface 3a) and the sealing sheet 4 (see FIG. 3) and shields ultraviolet rays. The acrylic plate 5 has a substantially rectangular shape. When the acrylic plate 5 is fixed to the outer surface 2c of the housing 2 by a screw member 8 (described below) (see FIG. 4), the opening 2d is not exposed by the acrylic plate 5. The acrylic plate 5 is an example of an "ultraviolet shielding member" in the claims.

According to the present embodiment, the acrylic plate 5 (opening 2d) is provided in a substantially central portion of the housing 2 in a horizontal direction (direction X) in a state where the inverter body 1 is installed. Furthermore, the acrylic plate 5 is preferably provided in the vicinity of the position of the user's eyes in a vertical direction (direction Z).

Figure 3:
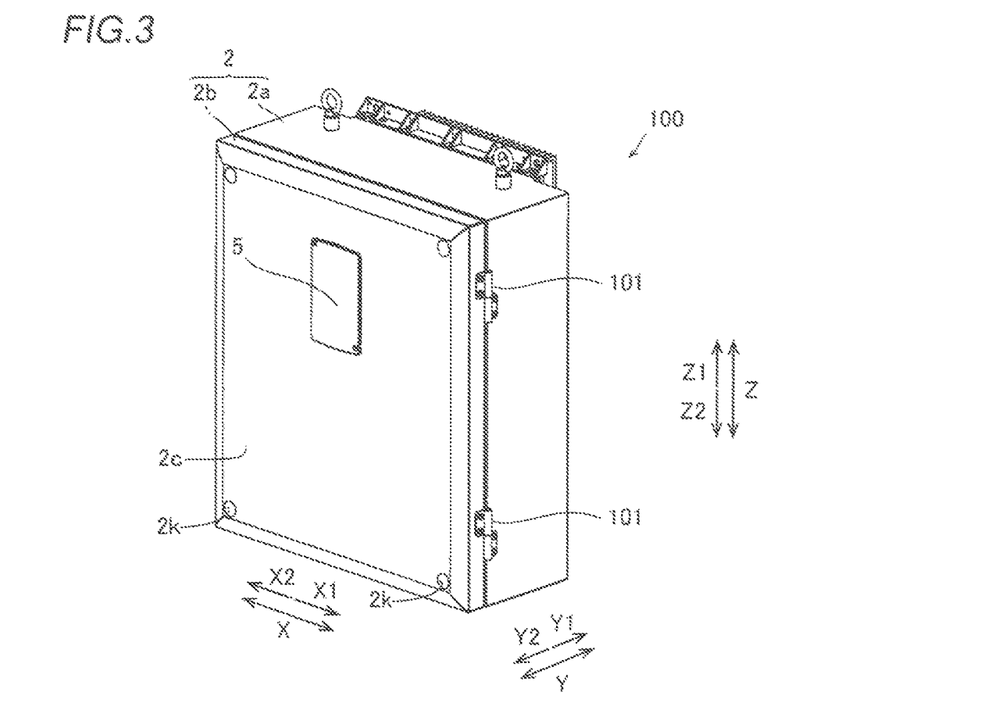
FIG. 3 is a perspective view showing a state where the operation panel of the inverter device according to the embodiment is not exposed.

As shown in FIG. 2, the acrylic plate 5 includes a transparent portion 5a to allow the user to visually recognize display of the operation panel 3 (liquid crystal display, display of an LED lamp, etc.) when the acrylic plate 5 covers the operation panel 3 (operation surface 3a) and the sealing sheet 4 (see FIG. 3). In the acrylic plate 5, portions other than the transparent portion 5a are opaque (black, for example). In the figures other than FIG. 2, the transparent portion 5a is not shown for simplicity.

According to the present embodiment, the acrylic plate 5 is openable and closable with respect to the outer surface 2c of the housing 2, and thus the operation panel 3 can be exposed. Specifically, the acrylic plate 5 is movable along the outer surface 2c of the housing 2 to expose the operation panel 3. The movement of the acrylic plate 5 is described below.

According to the present embodiment, the inverter device 100 includes a screw member 6 (decorative screw, for example) that attaches the acrylic plate 5 to the outer surface 2c of the housing 2. The screw member 6 attaches the acrylic plate 5 to the outer surface 2c of the housing 2 such that the acrylic plate 5 is pivotable along the outer surface 2c of the housing 2 to expose the operation panel 3. The screw member 6 is an example of a "first fastening member" in the claims.

Specifically, the acrylic plate 5 pivots toward the D1 direction side about the screw member 6 from a state where the acrylic plate 5 covers the operation panel 3 (operation surface 3a) and the sealing sheet 4 (see FIG. 3) such that the operation panel 3 (operation surface 3a) and the sealing sheet 4 are exposed. The acrylic plate 5 pivots toward the D2 direction side about the screw member 6 from a state where the operation panel 3 (operation surface 3a) and the sealing sheet 4 are exposed such that the acrylic plate 5 covers the operation panel 3 (operation surface 3a) and the sealing sheet 4.

Figure 4:
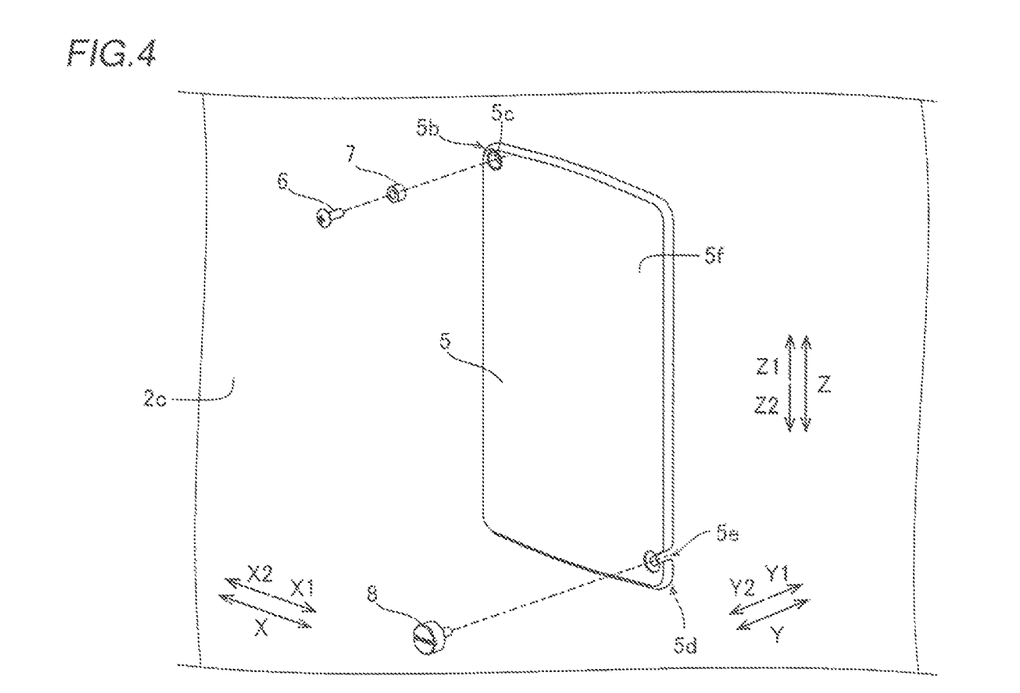
FIG. 4 is an enlarged view of FIG. 3.

As shown in FIG. 4, a through-hole 5c is provided at a corner 5b (an upper left corner when the outer surface 2c is viewed from the front) of the acrylic plate 5. In addition, a cutout 5e is provided at a corner 5d (a lower right corner when the outer surface 2c is viewed from the front) corresponding to the diagonal corner of the corner 5b of the acrylic plate 5. An open end of the cutout 5e is provided on a side on the X1 direction side of two sides of the substantially rectangular acrylic plate 5 that extend in the direction Z. Furthermore, the open end of the cutout 5e is continuous with a groove 5j (see FIG. 7, described below) of the cutout 5e. The corner 5b and the corner 5d are examples of a "first corner" and a "second corner" in the claims, respectively.

Figure 5:
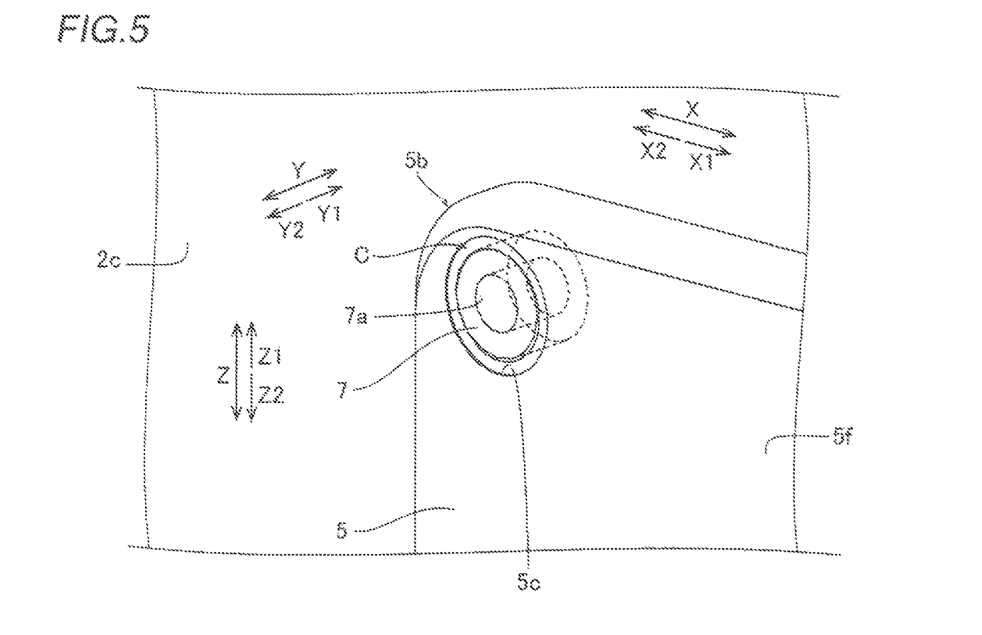
FIG. 5 is an enlarged perspective view of the vicinity of the upper left corner of an acrylic plate of the inverter device according to the embodiment.

The inverter device 100 includes a spacer member 7 attached to the through-hole 5c. The spacer member 7 is fitted into the through-hole 5c. The spacer member 7 has a cylindrical shape and includes a through-hole 7a (see FIG. 5) through which the screw member 6 passes. Furthermore, a minute air gap C (see FIG. 5) is provided between the spacer member 7 and the through-hole 5c. The spacer member 7 is made of stainless steel. In FIG. 5, the screw member 6 is not shown for simplicity.

According to the present embodiment, the inverter device 100 includes the screw member 8 that fixes the acrylic plate 5 to the outer surface 2c of the housing 2 in a state where the screw member 8 passes through the cutout 5e. The screw member 8 is a thumbscrew member. Unevenness (not shown) is provided on the head 8a (see FIG. 8) of the screw member 8. Thus, the user can easily pinch (turn) the screw member 8. The screw member 8 can also be fastened and unfastened by a minus driver or the like. The screw member 8 is an example of a "second fastening member" or a "thumbscrew member" in the claims.

Figure 6:
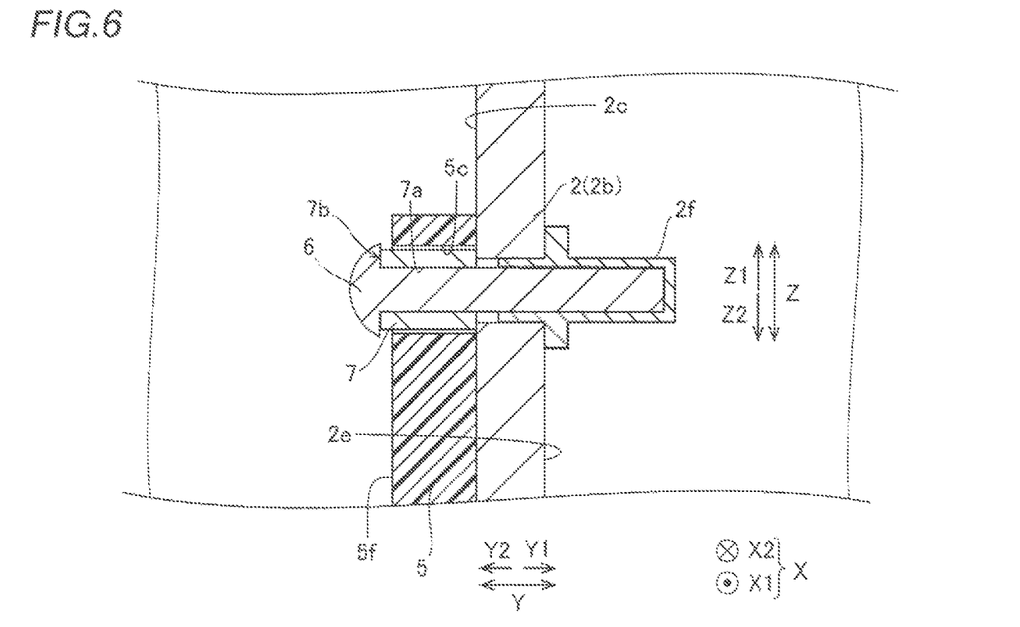
FIG. 6 is an enlarged sectional view illustrating the fastened state of a screw member, which passes through a through-hole, of the inverter device according to the embodiment.

According to the present embodiment, as shown in FIG. 6, the screw member 6 is fastened to the outer surface 2c of the housing 2 in a state where the screw member 6 passes through the through-hole 7a of the spacer member 7. Accordingly, the acrylic plate 5 is attached to the outer surface 2c of the housing 2 so as to be pivotable along the outer surface 2c of the housing 2. Specifically, the inner surface of the through-hole 5c of the acrylic plate 5 is slid along the outer surface of the spacer member 7 such that the acrylic plate 5 pivots.

A nut 2f into which the screw member 6 is inserted is provided on the rear surface 2e of the housing lid 2b of the housing 2. The screw member 6 that passes through the through-hole 7a of the spacer member 7 is inserted and screwed into the nut 2f such that the acrylic plate 5 is attached to the outer surface 2c of the housing 2. The nut 2f is fixedly press-fitted from the rear surface 2e side of the housing lid 2b of the housing 2.

An end 7b of the spacer member 7 on the opposite side (Y2 direction side) to the housing 2 protrudes from a surface 5f of the acrylic plate 5 toward the opposite side (Y2 direction side) to the housing 2. Thus, the screw member 6 (the head of the screw member 6) and the surface 5f of the acrylic plate 5 are separated from each other by the end 7b of the spacer member 7.

Figure 7:
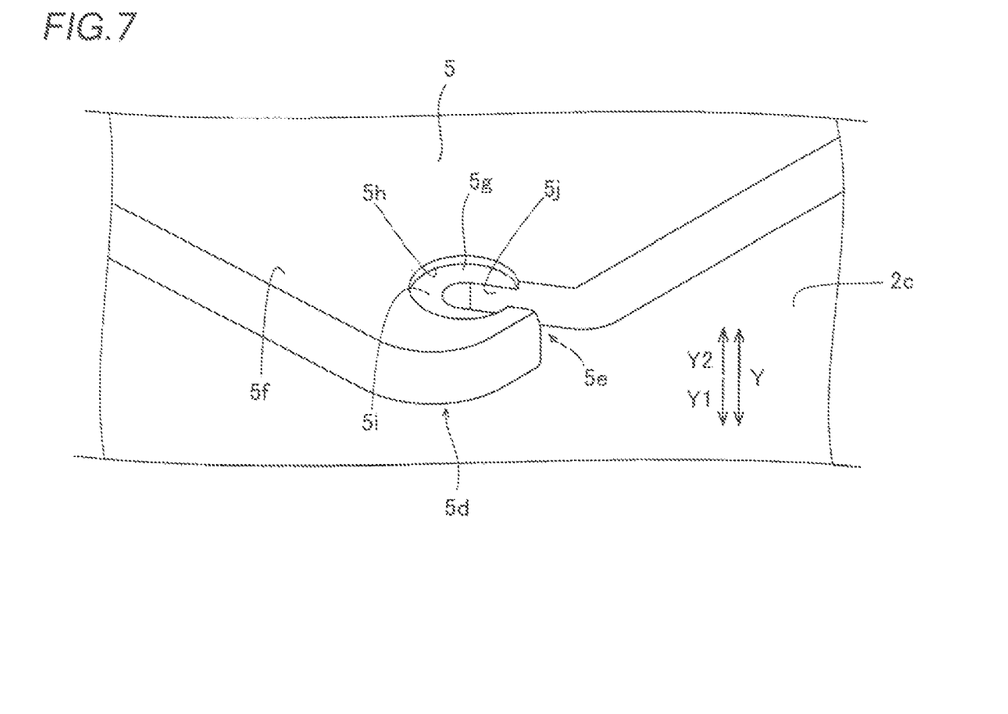
FIG. 7 is an enlarged sectional view of the vicinity of the lower right corner of the acrylic plate of the inverter device according to the embodiment.

As shown in FIG. 7, the cutout 5e includes a recess 5g recessed toward the housing 2 (outer surface 2c side, Y1 direction side). The recess 5g has an arcuate shape when the outer surface 2c is viewed from the front side (Y2 direction side). The recess 5g includes an inner wall surface 5h and a bottom surface 5i. The cutout 5e includes the groove 5j continuous with the recess 5g. In FIG. 7, the screw member 8 is not shown for simplicity.

Figure 8:
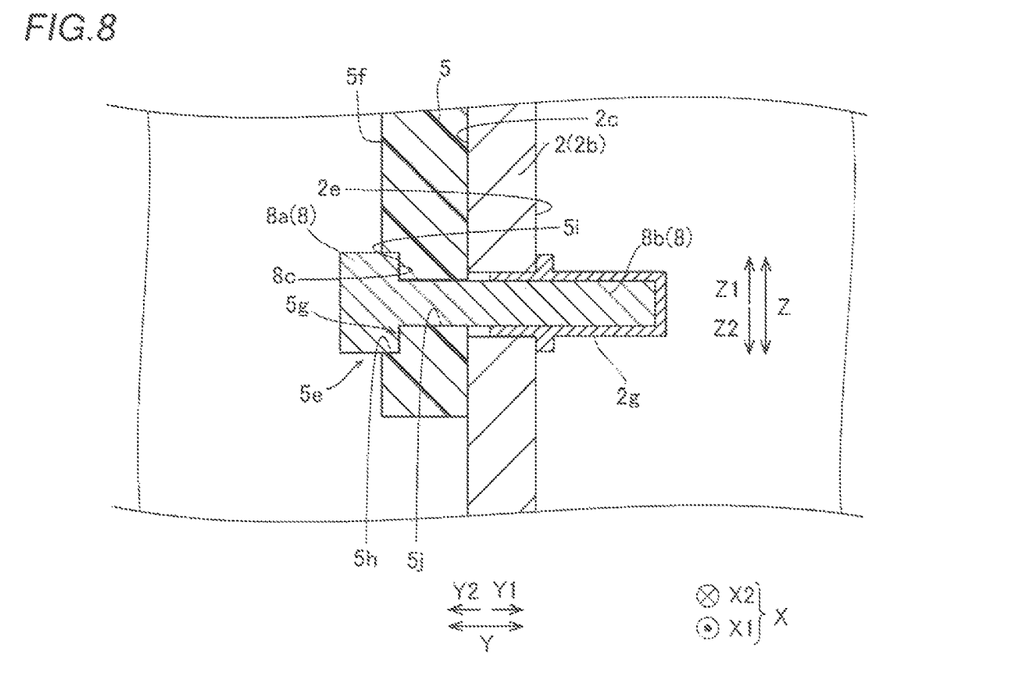
FIG. 8 is an enlarged sectional view illustrating the fastened state of a screw member, which passes through a cutout, of the inverter device according to the embodiment.

As shown in FIG. 8, when the end of the head 8a of the screw member 8 on the housing 2 side (outer surface 2c side, Y1 direction side) is inserted into the recess 5g, the bottom surface 8c of the head 8a on the housing 2 side (outer surface 2c side, Y1 direction side) and the bottom surface 5i of the recess 5g come into contact with each other. A screw 8b of the screw member 8 passes through the groove 5j and is inserted to the rear surface 2e side of the housing 2. In this case, the head 8a and the inner wall surface 5h of the recess 5g interfere with each other such that the acrylic plate 5 is not pivoted but is fixed. According to the present embodiment, the screw 8b denotes a portion of the screw member 8 other than the head 8a.

Figure 9:
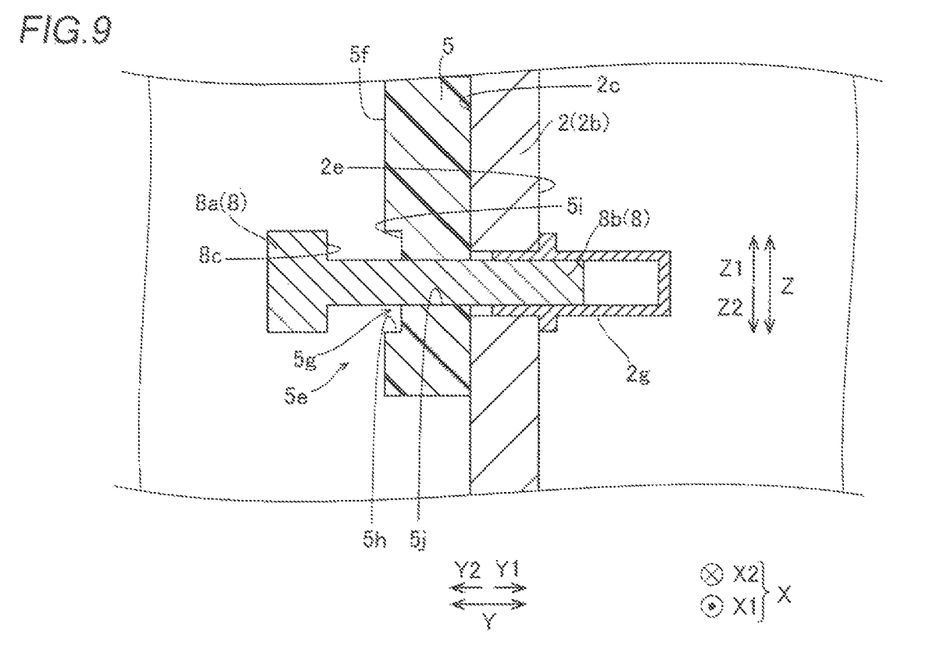
FIG. 9 is an enlarged sectional view illustrating the loosened state of the screw member, which passes through the cutout, of the inverter device according to the embodiment.

According to the present embodiment, when the screw member 8 is loosened, as shown in FIG. 9, the screw member 8 passes through the cutout 5e such that the acrylic plate 5 becomes pivotable. Specifically, when the screw member 8 is loosened and moved (pulled out) toward the Y2 direction side, the head 8a and the inner wall surface 5h of the recess 5g no longer interfere with each other. Thus, the screw 8b of the screw member 8 can pass through the groove 5j, and the acrylic plate 5 becomes pivotable. The groove 5j has an arcuate shape centered on the through-hole 5c (see FIG. 4).

A nut 2g into which the screw member 8 is inserted is provided on the rear surface 2e of the housing lid 2b of the housing 2. The screw member 8 that has passed through the groove 5j is inserted and screwed into the nut 2g such that the acrylic plate 5 is attached to the outer surface 2c of the housing 2. The nut 2g is fixedly press-fitted from the rear surface 2e side of the housing lid 2b of the housing 2.

Figure 10:
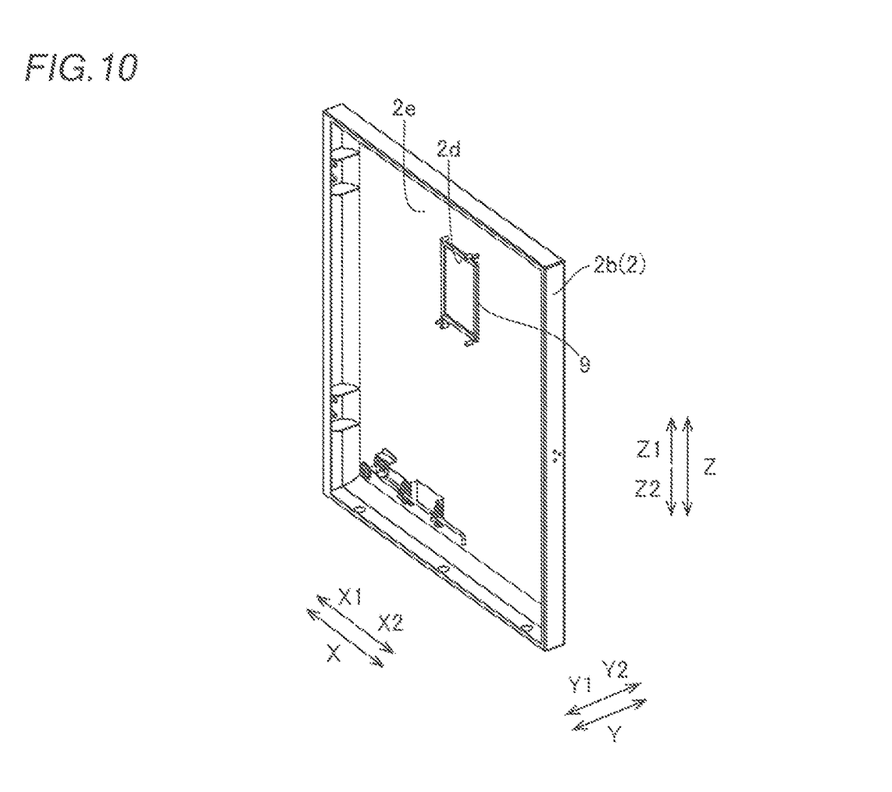
FIG. 10 is a perspective view illustrating the configuration of the rear side of a housing lid of the inverter device according to the embodiment.

As shown in FIG. 10, the inverter device 100 (see FIG. 1) includes a gasket 9 provided on the rear surface 2e of the housing 2 (housing lid 2b) in close contact with the circumferential edge of the opening 2d. That is, the gasket 9 has a rectangular shape and a frame shape. The gasket 9 and the rear surface 2e of the housing 2 (housing lid 2b) are bonded to each other by a double-sided tape (not shown). In FIG. 10, members unnecessary for illustration are not shown for simplicity. The gasket 9 is an example of an "operating section-side sealing member" in the claims.

Figure 11:
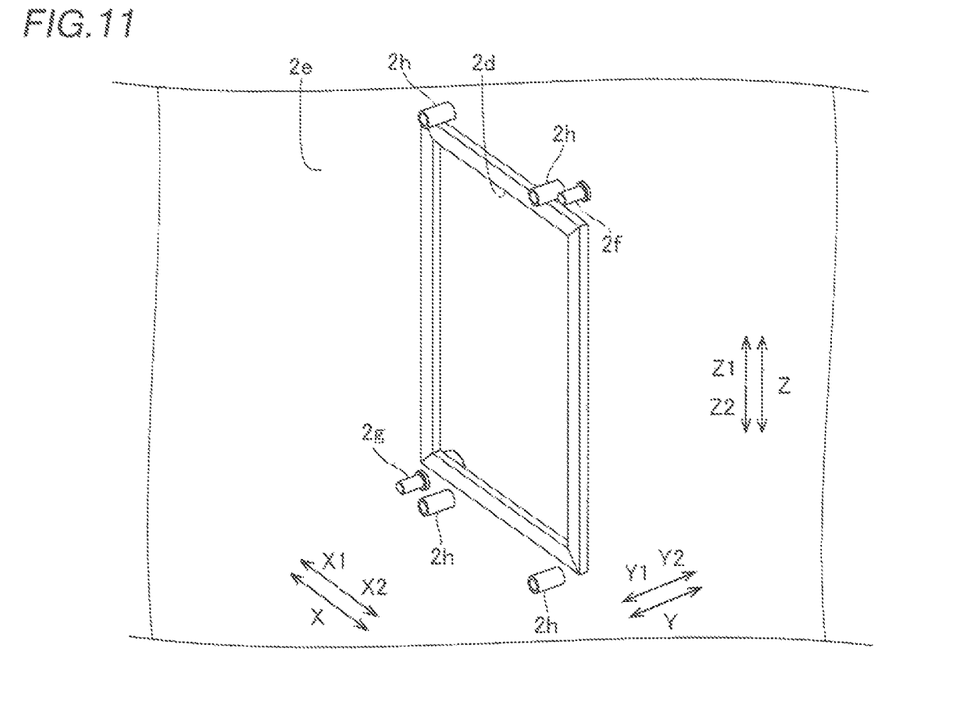
FIG. 11 is an enlarged view of FIG. 10.

As shown in FIG. 11, a nut 2h is provided in the vicinity of each of the four corners of the frame-shaped gasket 9 on the rear surface 2e of the housing 2 (housing lid 2b). Screw members 12 (see FIG. 12) described below can be inserted into the nuts 2h from the opposite side (Y1 direction side) to the housing 2 (housing lid 2b).

Figure 12:
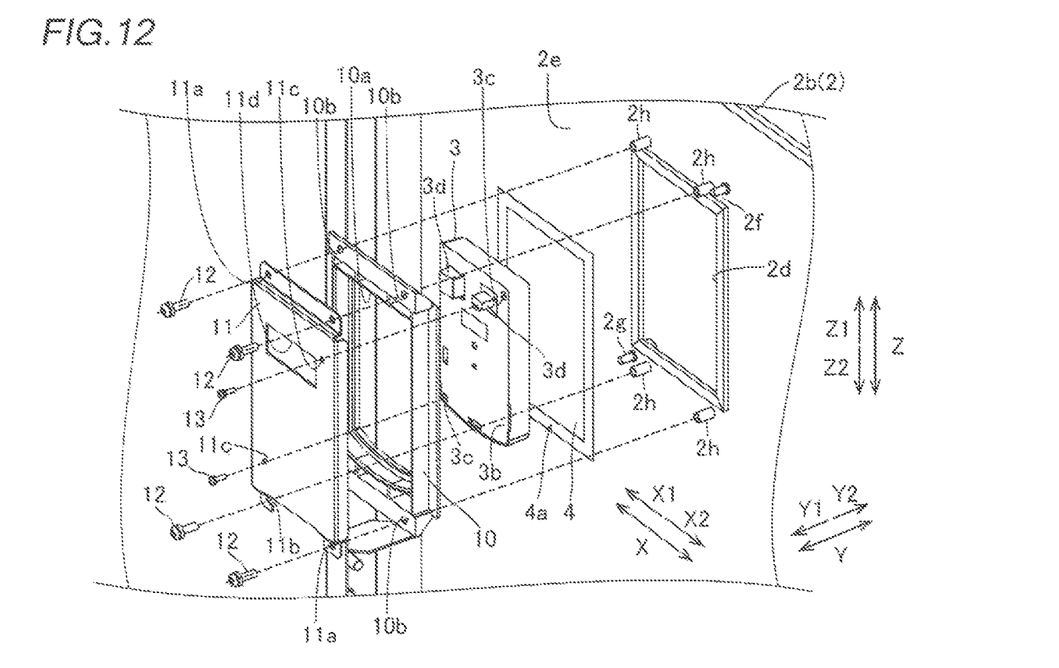
FIG. 12 is a perspective view illustrating a method for fixing members disposed on the rear side of the housing lid of the inverter device according to the embodiment.
Figure 13:
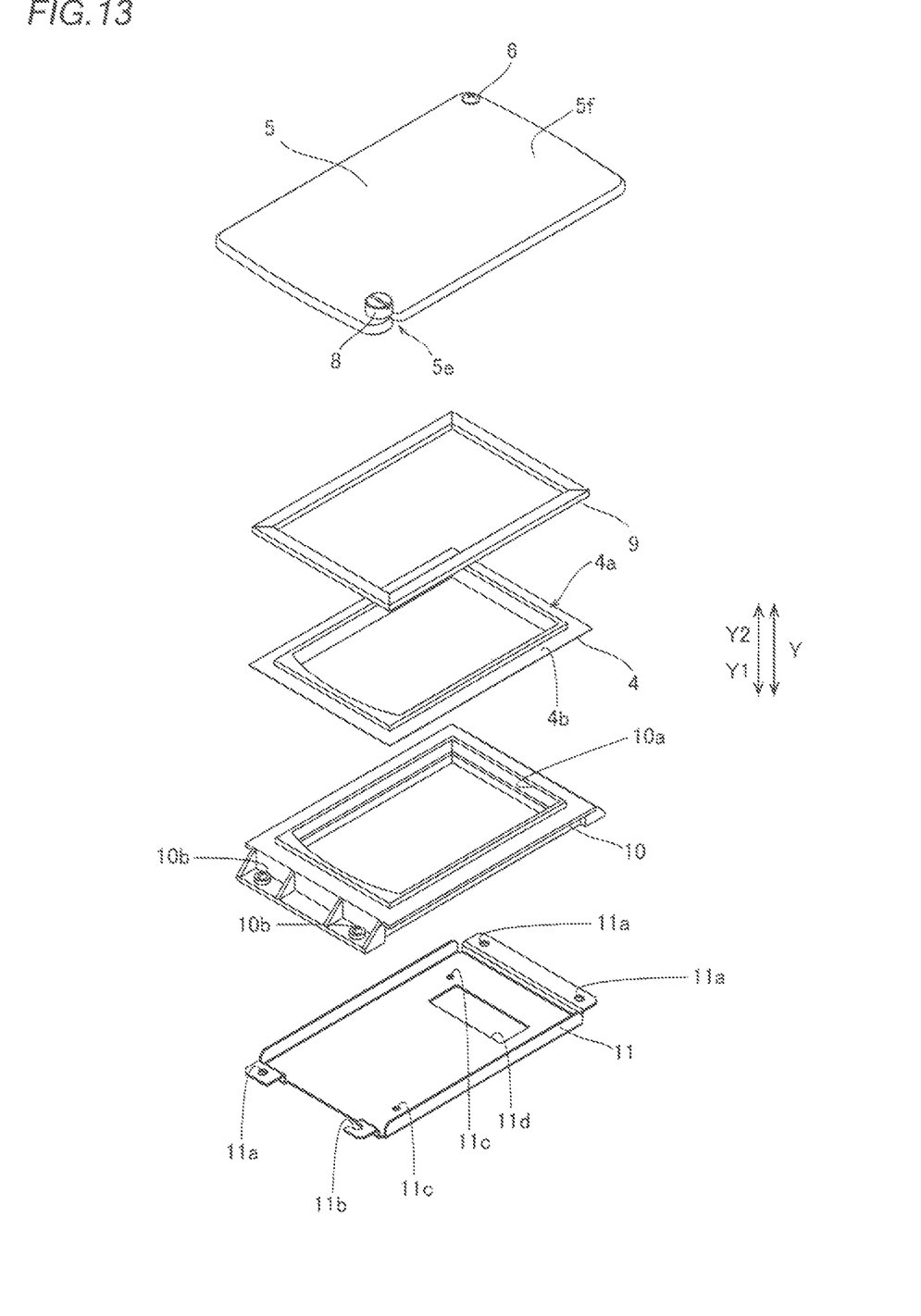
FIG. 13 is a perspective view of the members disposed on the rear side of the housing lid and the ultraviolet shielding member of the inverter device according to the embodiment, as viewed from the ultraviolet shielding member side.

According to the present embodiment, as shown in FIG. 12, the gasket 9 is disposed in close contact with a surface 4b (see FIG. 13) of the outer edge 4a of the sealing sheet 4 on the housing 2 side (Y2 direction side). That is, the sealing sheet 4 is provided on the opposite side (Y1 direction side) to the housing 2 (housing lid 2b) relative to the gasket 9. The operation panel 3 is provided on the opposite side (Y1 direction side) to the housing 2 (housing lid 2b) relative to the sealing sheet 4. In addition, the operation panel 3 is surrounded by the outer edge 4a of the sealing sheet 4 as viewed from a direction side (Y1 direction side) perpendicular to the rear surface 2e of the housing 2. In FIG. 13, the housing 2 and the operation panel 3 are not shown for simplicity.

On a surface 3b of the operation panel 3 on the opposite side (Y1 direction side) to the housing 2 (housing lid 2b), a screw insertion hole 3c is provided in the vicinity of each of two of the four corners (upper right and lower left corners as viewed from the Y1 direction side).

Connectors 3d to which wiring (not shown) is connected are provided on the surface 3b of the operation panel 3.

According to the present embodiment, the inverter device 100 (see FIG. 1) includes an operation panel fixture 10 provided on the opposite side (Y1 direction side) to the housing 2 relative to the operation panel 3. The operation panel 3 is sandwiched between the operation panel fixture 10 and the sealing sheet 4. The operation panel fixture 10 and the sealing sheet 4 (outer edge 4a) are bonded to each other by a double-sided tape. The operation panel fixture 10 is an example of a "fixture" in the claims.

A substantially rectangular opening 10a for fixing (holding) the operation panel 3 is provided in a central portion of the operation panel fixture 10. Furthermore, a screw insertion hole 10b is provided in the vicinity of each of the four corners of the operation panel fixture 10.

The inverter device 100 includes a sheet metal member 11 fixed to the rear surface 2e of the housing 2 (housing lid 2b) in a state where the operation panel fixture 10, the operation panel 3, the sealing sheet 4, and the gasket 9 are sandwiched between the sheet metal member 11 and the rear surface 2e of the housing 2 (housing lid 2b). That is, the sheet metal member 11 is provided on the opposite side (Y1 direction side) to the housing 2 relative to the operation panel fixture 10. When the sheet metal member 11 is fixed to the rear surface 2e of the housing 2 (housing lid 2b), the gasket 9 is sandwiched between the sheet metal member 11 and the rear surface 2e.

A screw insertion hole 11a is provided in the vicinity of each of three (upper left, upper right, and lower right corners as viewed from the Y1 direction side) of the four corners of the sheet metal member 11. A screw insertion cutout 11b is provided in the vicinity of one (a lower left corner as viewed from the Y1 direction side) of the four corners of the sheet metal member 11. As viewed from the Y1 direction side, instead of the screw insertion cutout 11b, the screw insertion hole 11a may be provided at the lower left corner.

A screw insertion hole 11c is provided in the vicinity of each of two (upper right and lower left corners as viewed from the Y1 direction side) of the four corners of the sheet metal member 11.

A hole 11d that exposes the connectors 3d of the operation panel 3 is provided in the sheet metal member 11. That is, the connectors 3d are inserted into the hole 11d of the sheet metal member 11 via the opening 10a of the operation panel fixture 10.

According to the present embodiment, the inverter device 100 includes the screw members 12 fastened to the rear surface 2e of the housing 2 (housing lid 2b) via the sheet metal member 11 in a state where the operation panel fixture 10, the operation panel 3, the sealing sheet 4, and the gasket 9 are sandwiched between the sheet metal member 11 and the rear surface 2e of the housing 2 (housing lid 2b). Specifically, the screw members 12 pass through the screw insertion hole 11a (screw insertion cutout 11b) of the metal plate member 11 and the screw insertion hole 10b of the operation panel fixture 10, and are inserted (fastened) into the nuts 2h. The screw member 12 is an example of a "third fastening member" in the claims.

The inverter device 100 includes screw members 13. The screw members 13 pass through the screw insertion holes 11c of the sheet metal member 11 and the opening 10a of the operation panel fixture 10, and are inserted into the screw insertion holes 3c of the operation panel 3.

Figure 15:
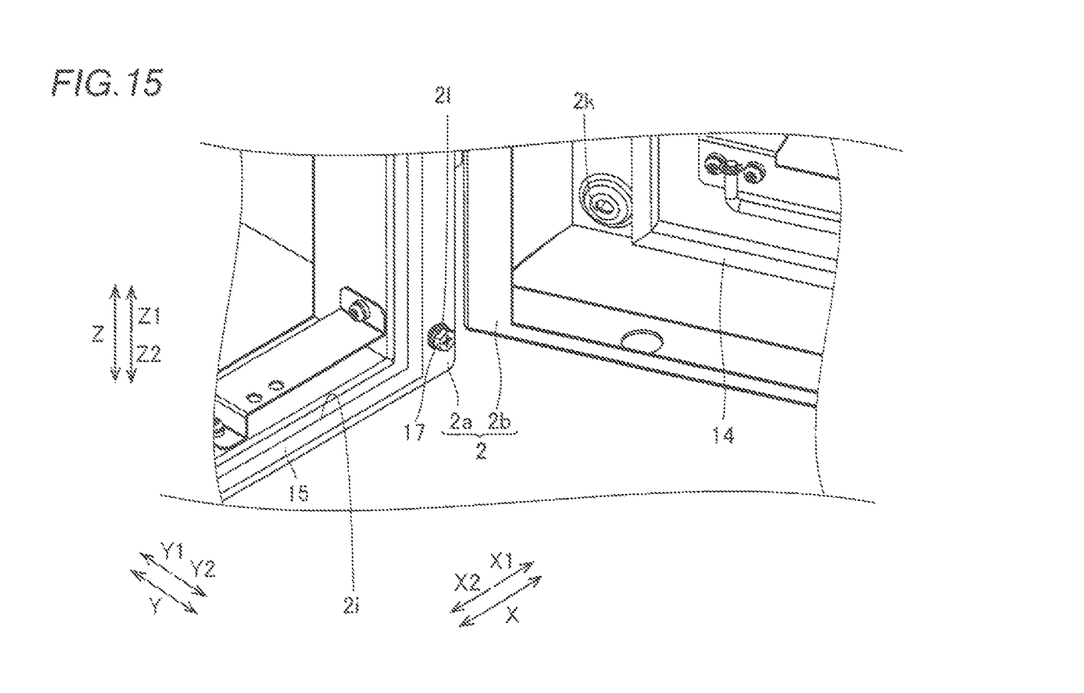
FIG. 15 is an enlarged view of FIG. 14.

According to the present embodiment, as shown in FIGS. 14 and 15, the inverter device 100 includes a gasket 14 provided between the housing body 2a and the housing lid 2b. The gasket 14 is bonded to the rear surface 2e of the housing lid 2b. The gasket 14 has a frame shape so as to surround the operation panel 3. The gasket 14 is an example of a "housing-side sealing member" in the claims.

A frame-shaped opening 2i that exposes the inverter body 1 is provided on the front side (Y2 direction side) of the housing body 2a. On the front side (Y2 direction side) of the housing body 2a, the circumferential edge of the opening 2i includes a frame-shaped gasket receiving portion 15 that comes into contact with the gasket 14 when the housing lid 2b is closed.

The housing body 2a includes a lock 16 that temporarily fixes the housing lid 2b when the housing lid 2b is closed. The lock 16 is provided on a side surface 2j on the X2 direction side relative to the outer surface 2c (see FIG. 1). Furthermore, the lock 16 is provided in the vicinity of the center of the side surface 2j in the direction Z.

The housing body 2a and the housing lid 2b are fixed by screw members 17 (see FIG. 15) in addition to the lock 16. A screw member 17 is provided in the vicinity of each of the four corners of the opening 2i. Furthermore, insertion holes 2k (see FIG. 15) into which the screw members 17 are inserted are provided in the housing lid 2b. An insertion hole 2k is provided in the vicinity of each of the four corners of the outer surface 2c (see FIG. 1).

Insertion holes 2l (see FIG. 15) into which the screw members 17 are inserted are provided in the housing body 2a. In FIG. 15, the screw members 17 are inserted only into the insertion holes 2l, but in reality, the screw members 17 pass through the insertion holes 2k and are inserted into the insertion holes 2l.

When the housing lid 2b is closed, the housing body 2a and the housing lid 2b are fixed by the four screw members 17 in a state where the housing body 2a and the housing lid 2b are temporarily fixed by the lock 16.

A curved portion 2m (see FIG. 1) is provided on the periphery of the outer surface 2c of the housing 2 (housing lid 2b). That is, the curved portion 2m surrounds the outer surface 2c. Thus, it is possible to improve the mechanical strength of the housing lid 2b. Consequently, it is possible to significantly reduce or prevent an increase in the number of screw members 17 that fixes the housing body 2a and the housing lid 2b.

Advantageous Effects of Present Embodiment

According to the present embodiment, the following advantageous effects are achieved.

According to the present embodiment, as described above, the inverter device 100 includes the sealing sheet 4 that hermetically covers the operation panel 3 and the acrylic plate 5 that covers the operation panel 3 and the sealing sheet 4 and shields ultraviolet rays. Thus, the acrylic plate 5 can significantly reduce or prevent irradiation of the sealing sheet 4 with ultraviolet rays, and thus it is possible to significantly reduce or prevent deterioration of the sealing sheet 4 due to ultraviolet rays. Consequently, it is possible to significantly reduce or prevent deterioration of the sealing property of the operation panel 3 due to the deterioration of the sealing sheet 4.

According to the present embodiment, as described above, in the inverter device 100, the acrylic plate 5 is openable and closable with respect to the outer surface 2c of the housing 2 to expose the operation panel 3. Thus, only when necessary, such as when the user operates the operation panel 3, the acrylic plate 5 can be opened to expose the operation panel 3. Consequently, the acrylic plate 5 can significantly reduce or prevent deterioration of the sealing sheet 4 due to ultraviolet rays while user's operability is ensured.

According to the present embodiment, as described above, in the inverter device 100, the acrylic plate 5 is movable along the outer surface 2c of the housing 2 to expose the operation panel 3. Thus, when the user moves the acrylic plate 5, the acrylic plate 5 does not move toward the user (front side), and thus even in a narrow space where a device is disposed around the acrylic plate 5, the acrylic plate 5 can be easily moved.

According to the present embodiment, as described above, the screw member 6 attaches the acrylic plate 5 to the outer surface 2c of the housing 2 such that the acrylic plate 5 is pivotable along the outer surface 2c of the housing 2 to expose the operation panel 3. Thus, the acrylic plate 5 can be pivoted using the screw member 6 used to attach the acrylic plate 5 to the outer surface 2c of the housing 2, and thus it is possible to simplify the device configuration and significantly reduce or prevent an increase in the number of components.

According to the present embodiment, as described above, in the inverter device 100, the screw member 6 is fastened to the outer surface 2c of the housing 2 in a state where the screw member 6 passes through the spacer member 7 such that the acrylic plate 5 is attached to the outer surface 2c of the housing 2 so as to be pivotable along the outer surface 2c of the housing 2. Thus, the spacer member 7 is used such that the acrylic plate 5 is not directly fastened to the outer surface 2c of the housing 2 by the screw member 6, and thus the acrylic plate 5 can be easily pivoted.

According to the present embodiment, as described above, the through-hole 5c to which the spacer member 7 is attached is provided in the vicinity of the corner 5b of the substantially rectangular acrylic plate 5, and the cutout 5e is provided in the vicinity of the corner 5d corresponding to the diagonal corner of the corner 5b. Furthermore, the inverter device 100 includes the screw member 8 that fixes the acrylic plate 5 to the outer surface 2c of the housing 2 in a state where the screw member 8 passes through the cutout 5e. Thus, when the acrylic plate 5 is not pivoted, the acrylic plate 5 can be securely fixed by the screw member 8. Furthermore, the screw member 8 passes through the cutout 5e such that the screw member 8 can be pulled out of the cutout 5e via the open end of the cutout 5e. Thus, it is possible to pivot the acrylic plate without removing the screw member 8 from the outer surface 2c.

According to the present embodiment, as described above, the screw member 8 includes the thumbscrew member. Furthermore, when the thumbscrew member (screw member 8) is loosened, the thumbscrew member (screw member 8) passes through the cutout 5e such that the acrylic plate 5 is pivotable. Thus, the screw member 8 includes the thumbscrew member such that the user can easily loosen (tighten) the screw member 8 by pinching the same with their fingers without using a tool. Consequently, the user can easily perform an operation of loosening (tightening) the screw member 8 in order to pivot (fix) the acrylic plate 5.

According to the present embodiment, as described above, the acrylic plate 5 is provided in the substantially central portion of the housing 2 in the horizontal direction (direction X) in a state where the inverter body 1 is installed. Thus, when the acrylic plate 5 is pivoted to expose the operation panel 3, it is possible to significantly reduce or prevent protrusion of the acrylic plate 5 in the horizontal direction (direction X) from an end of the housing 2 in the horizontal direction (direction X) as compared with the case where the acrylic plate 5 is provided on the end side of the housing 2 in the horizontal direction (direction X). Thus, it is possible to significantly reduce or prevent interference between the acrylic plate 5 and a surrounding device when the other device is disposed adjacent to the inverter device 100 in the horizontal direction (direction X).

Furthermore, as compared with the case where the acrylic plate 5 is provided on the end side of the housing 2 in the horizontal direction (direction X), it is possible to significantly reduce or prevent interference between the user and the other device when the other device is disposed adjacent to the inverter device 100 in the horizontal direction (direction X), and it is possible to significantly reduce or prevent a reduction in the working efficiency of the user.

According to the present embodiment, as described above, the inverter device 100 includes the basket 9 provided in close contact with the circumferential edge of the opening 2d on the rear surface 2e of the housing 2 and disposed in close contact with the surface 4b of the outer edge 4a of the sealing sheet 4 on the housing 2 side (Y2 direction side). Thus, as compared with the case where the gasket 9 and the sealing sheet 4 are disposed in close contact with each other on the outside (outer surface 2c side) of the housing 2, it is possible to significantly reduce or prevent release of close contact between the gasket 9 and the sealing sheet 4 due to external factors. Consequently, it is possible to further significantly reduce or prevent deterioration of the sealing property of the operation panel 3 provided by the sealing sheet 4.

According to the present embodiment, as described above, the inverter device 100 includes the operation panel fixture 10 provided on the opposite side (Y1 direction side) of the operation panel 3 to the housing 2 and that sandwiches the operation panel 3 with the sealing sheet 4, and the sheet metal member 11 fixed to the rear surface 2e of the housing 2 in a state where the operation panel fixture 10, the operation panel 3, the sealing sheet 4, and the gasket 9 are sandwiched between the sheet metal member 11 and the rear surface 2e of the housing 2. Thus, the operation panel 3 and the sealing sheet 4 can be securely held by the operation panel fixture 10 and the sheet metal member 11.

According to the present embodiment, as described above, the inverter device 100 includes the screw members 12 fastened to the rear surface 2e of the housing 2 via the sheet metal member 11 in a state where the operation panel fixture 10, the operation panel 3, the sealing sheet 4, and the gasket 9 are sandwiched between the sheet metal member 11 and the rear surface 2e of the housing 2. Thus, the operation panel 3 and the sealing sheet 4 can be pressure-bonded by the screw members 12. Consequently, the sealing property of the operation panel 3 provided by the sealing sheet 4 can be improved.

According to the present embodiment, as described above, the inverter device 100 includes the gasket 14 provided between the housing body 2a and the housing lid 2b. Thus, the gasket 14 can significantly reduce or prevent entry of moisture, dust, etc. into the housing body 2a.

Modified Examples

The embodiment disclosed this time must be considered as illustrative in all points and not restrictive. The range of the present invention is not shown by the above description of the embodiment but by the scope of claims for patent, and all modifications (modified examples) within the meaning and range equivalent to the scope of claims for patent are further included.

For example, while the ultraviolet shielding member (acrylic plate 5) is pivoted along the outer surface of the housing in the aforementioned embodiment, the present invention is not restricted to this. For example, the ultraviolet shielding member (acrylic plate 5) may alternatively include a hinge mechanism, and may alternatively be opened and closed using the hinge mechanism. Furthermore, the ultraviolet shielding member (acrylic plate 5) may alternatively be slid horizontally or vertically along the outer surface of the housing.

While the ultraviolet shielding member (acrylic plate 5) has a substantially rectangular shape in the aforementioned embodiment, the present invention is not restricted to this. The ultraviolet shielding member (acrylic plate 5) may alternatively have a shape (a circular shape, for example) other than the rectangular shape.

While the second fastening member (screw member 8) is provided in the vicinity of the second corner (corner 5d) corresponding to the diagonal corner of the first corner (corner 5b) where the first fastening member (screw member 6) is provided in the aforementioned embodiment, the present invention is not restricted to this. For example, the second fastening member (screw member 8) may alternatively be provided at a corner other than the first corner (corner 5b) and the second corner (corner 5d).

While the first corner (corner 5b) where the first fastening member (screw member 6) is provided is an upper left corner of the ultraviolet shielding member (acrylic plate 5) when the ultraviolet shielding member (acrylic plate 5) is viewed from the front in the aforementioned embodiment, the present invention is not restricted to this. For example, when the ultraviolet shielding member (acrylic plate 5) is viewed from the front, the first corner (corner 5b) may alternatively be a corner (an upper right, lower right, or lower left corner) of the ultraviolet shielding member (acrylic plate 5) other than the upper left corner.

While the second fastening member (screw member 8) is provided only at one corner (corner 5d) of the ultraviolet shielding member (acrylic plate 5) in the aforementioned embodiment, the present invention is not restricted to this. For example, the second fastening member (screw member 8) may alternatively be provided at a plurality of corners of the ultraviolet shielding member (acrylic plate 5).

While the ultraviolet shielding member (acrylic plate 5) is a plate-shaped member in the aforementioned embodiment, the present invention is not restricted to this. For example, the ultraviolet shielding member may alternatively be a member having a shape other than a plate shape.

While the ultraviolet shielding member is made of acrylic in the aforementioned embodiment, the present invention is not restricted to this. For example, the ultraviolet shielding member may alternatively be a material (polycarbonate, for example) having a function of shielding ultraviolet rays other than acrylic.

While the sheet member (sealing sheet 4) is made of PET resin in the aforementioned embodiment, the present invention is not restricted to this. The sheet member (sealing sheet 4) may alternatively be made of resin other than PET resin.

While the ultraviolet shielding member (acrylic plate 5) is partially transparent in the aforementioned embodiment, the present invention is not restricted to this. The entire ultraviolet shielding member (acrylic plate 5) may alternatively be transparent.

What is claimed is:

1. An inverter device comprising:
an inverter body;
a housing that covers the inverter body and has an opening;
an operating section which is provided at a position concaved from the opening of the housing, is attached to the housing and through which the inverter body is operated;
a sheet member that is provided at a position concaved from the opening of the housing and hermetically covers the operating section; and
an ultraviolet shielding member that covers the operating section and the sheet member via the opening of the housing and shields ultraviolet rays,
wherein the sheet member is provided on a rear surface of the housing.

2. The inverter device according to claim 1, wherein the ultraviolet shielding member is openable and closable with respect to an outer surface of the housing to expose the operating section.

3. The inverter device according to claim 1, wherein
the outer surface of the housing has a substantially rectangular shape as viewed from a front side of the inverter body, and
the ultraviolet shielding member is provided in a substantially central portion of the housing in a horizontal direction in a state where the inverter body is installed.

4. The inverter device according to claim 1, wherein
the housing includes a box-shaped housing body that houses the inverter body, and an openable and closable housing lid to which the operating section is attached and that covers the box-shaped housing body, and
the inverter device further comprises a housing-side sealing member provided between the housing body and the housing lid.

5. The inverter device according to claim 1, wherein the ultraviolet shielding member includes a transparent portion through which the sheet member and the operating section are seen from an outside of the housing when the ultraviolet shielding member covers the opening of the housing, and an opaque portion formed at a portion other than the transparent portion.

6. The inverter device according to claim 1, further comprising a sealing member arranged on the rear surface of the housing,
wherein the sheet member is attached to the housing without a gap through the sealing member.

7. An inverter device comprising:
an inverter body;
a housing that covers the inverter body;
an operating section which is attached to the housing and through which the inverter body is operated;
a sheet member that hermetically covers the operating section; and
an ultraviolet shielding member that covers the operating section and the sheet member and shields ultraviolet rays,
wherein the ultraviolet shielding member is openable and closable with respect to an outer surface of the housing to expose the operating section, and
the ultraviolet shielding member is movable along the outer surface of the housing to expose the operating section.

8. The inverter device according to claim 7, further comprising a first fastening member that attaches the ultraviolet shielding member to the outer surface of the housing,
wherein the first fastening member attaches the ultraviolet shielding member to the outer surface of the housing such that the ultraviolet shielding member is pivotable along the outer surface of the housing to expose the operating section.

9. The inverter device according to claim 8, further comprising a spacer member which is provided in a vicinity of an outer edge of the ultraviolet shielding member and through which the first fastening member passes, wherein the first fastening member is fastened to the outer surface of the housing in a state where the first fastening member passes through the spacer member such that the ultraviolet shielding member is attached to the outer surface of the housing so as to be pivotable along the outer surface of the housing.

10. The inverter device according to claim 9, wherein the ultraviolet shielding member has a substantially rectangular shape,
a through-hole to which the spacer member is attached is provided in a vicinity of a first corner of the ultraviolet shielding member having the substantially rectangular shape, and a cutout is provided in a vicinity of a second corner corresponding to a diagonal corner of the first corner, and
the inverter device further comprises a second fastening member that fixes the ultraviolet shielding member to the outer surface of the housing in a state where the second fastening member passes through the cutout.

11. The inverter device according to claim 10, wherein the second fastening member includes a thumbscrew member, and
when the thumbscrew member is loosened, the thumbscrew member passes through the cutout such that the ultraviolet shielding member is pivotable.

12. An inverter device comprising:
an inverter body;
a housing that covers the inverter body;
an operating section which is attached to the housing and through which the inverter body is operated;
a sheet member that hermetically covers the operating section; and
an ultraviolet shielding member that covers the operating section and the sheet member and shields ultraviolet rays,
wherein an opening is provided at a position of the housing where the operating section is disposed, and
the inverter device further comprises an operating section-side sealing member provided in close contact with a circumferential edge of the opening on a rear surface of the housing and disposed in close contact with a surface of an outer edge of the sheet member on the housing side.

13. The inverter device according to claim 12, further comprising:
a fixture provided on an opposite side of the operating section relative to the housing and that sandwiches the operating section with the sheet member; and
a sheet metal member fixed to the rear surface of the housing in a state where the fixture, the operating section, the sheet member, and the operating section-side sealing member are sandwiched between the sheet metal member and the rear surface of the housing.

14. The inverter device according to claim 13, further comprising a third fastening member fastened to the rear surface of the housing via the sheet metal member in a state where the fixture, the operating section, the sheet member, and the operating section-side sealing member are sandwiched between the sheet metal member and the rear surface of the housing.

* * * * *